United States Patent
Hong et al.

(10) Patent No.: US 7,438,120 B2
(45) Date of Patent: Oct. 21, 2008

(54) COOLING DEVICE

(75) Inventors: Alex Hong, Kaohsiung (TW); Miyahara Masaharu, Kaohsiung (TW)

(73) Assignee: Sunowealth Electric Machine Industry Co., Ltd., Kaohsiung (TW)

( * ) Notice: Subject to any disclaimer, the term of this patent is extended or adjusted under 35 U.S.C. 154(b) by 407 days.

(21) Appl. No.: 11/248,246

(22) Filed: Oct. 13, 2005

(65) Prior Publication Data
US 2007/0051496 A1    Mar. 8, 2007

(30) Foreign Application Priority Data
Sep. 2, 2005    (TW) .............................. 94130223 A

(51) Int. Cl.
*F28F 7/00* (2006.01)
(52) U.S. Cl. ............ 165/80.4; 165/104.33; 165/104.26; 417/420; 417/313; 220/795; 220/803; 220/804; 220/797; 220/798; 220/378; 220/783; 220/787; 220/806; 361/699; 361/700
(58) Field of Classification Search ................. 165/80.4, 165/104.33; 417/420, 313
See application file for complete search history.

(56) References Cited

U.S. PATENT DOCUMENTS

| | | | | |
|---|---|---|---|---|
| 3,108,710 A | * | 10/1963 | Lange et al. ................. | 220/613 |
| 4,589,564 A | * | 5/1986 | Olster et al. ................. | 220/582 |
| 4,819,953 A | * | 4/1989 | Joh ............................. | 277/591 |
| 5,071,140 A | * | 12/1991 | Quevedo del Rio ......... | 277/608 |
| 5,484,013 A | * | 1/1996 | Morikawa et al. ........... | 165/80.3 |
| 5,967,363 A | * | 10/1999 | Allen .......................... | 220/806 |
| 6,019,165 A | * | 2/2000 | Batchelder .................. | 165/80.3 |
| 6,119,462 A | * | 9/2000 | Busick et al. ................. | 62/3.64 |
| 6,408,937 B1 | * | 6/2002 | Roy ........................ | 165/104.33 |
| 6,668,911 B2 | * | 12/2003 | Bingler ....................... | 165/80.4 |
| 6,725,909 B1 | * | 4/2004 | Luo ....................... | 165/104.21 |
| 6,827,133 B1 | * | 12/2004 | Luo ....................... | 165/104.21 |
| 7,051,794 B2 | * | 5/2006 | Luo ....................... | 165/104.26 |
| 2003/0152462 A1 | * | 8/2003 | Yaegashi et al. ............. | 417/42 |
| 2005/0011633 A1 | * | 1/2005 | Garner et al. .......... | 165/104.26 |
| 2007/0096853 A1 | * | 5/2007 | Hong et al. ................. | 335/207 |
| 2007/0107880 A1 | * | 5/2007 | Hong et al. ............ | 165/104.33 |

* cited by examiner

*Primary Examiner*—Cheryl J. Tyler
*Assistant Examiner*—Brandon M Rosati
(74) *Attorney, Agent, or Firm*—Bacon & Thomas, PLLC

(57) ABSTRACT

The invention relates to a cooling device, which comprises a cooling fan and a heatsink. The heatsink is directly attached to the heating element to absorb its heat and the cooling fan is disposed on top of the heatsink to dissipate the heat. The heatsink includes a central heat dissipation body and a plurality of fins extending from the periphery of the central heat dissipation body. The central heat dissipation body has a fully-sealed hollow chamber filled with a cooling liquid and disposed an agitator. The agitator is disposed a magnetic element, and where the magnetic element corresponds to the rotor of the cooling fan must have a magnetically-attracting and mutually-dragging device in operation. By way of the magnetic attraction between the rotor of the cooling fan and the agitator, a better heat dissipation effect is secured, the chamber remains a fully-sealed room, and the cooling liquid overflow issue can be ruled out accordingly.

5 Claims, 5 Drawing Sheets

COOLING DEVICE

FIELD OF THE INVENTION

The invention relates to a cooling device, which is disposed for the central processing unit (CPU) of electronic products to absorb, transfer and dissipate the heat therein.

BACKGROUND OF THE INVENTION

The conventional CPU cooling method of electronic products attaches the heatsink made of aluminum or copper to the heating element, whereby the heat diffuses from the bottom to the top by means of the contact transfer, and further utilizes the cooling fan to dissipate the heat. However, as a result of constantly upgrading performance of the CPU, the increasing speed of the heat accumulation has made the heating element demand go far beyond the bounds of the heat transfer speed of the cooling device.

Therefore, in Appendix 1, Taiwan Patent Publication No. M259218 "Phase Change Cooling Device", there are a cylinder 10 and a plurality of fins 20 integrally formed on the cylinder 10. The cylinder 10 is formed an enclosed cavity 40 therein, where is filled with a working fluid capable of transforming between gas phase and liquid phase depending on the temperature variation, in an attempt to enhance the overall heat transfer efficiency of the cooling device by means of the working fluid with high thermal conductivity.

However, as the working fluid is still inside the cavity 40, when the heat gradually diffuses from bottom up, the fins 20 are in a non-isothermal phenomenon, which has a higher temperature over the top portion and a lower temperature over the bottom portion.

As such, in Appendix 2, Taiwan Patent Publication No. M584269 "Fins with perturbing liquid therein", the base 30 of the fin 40 is disposed an enclosed chamber 31 therein, where is filled with a thermal conductive liquid 32, and a perturbing device 60 thereon. The perturbing device 60 is composed of a driving device 62 and a perturbing element 61, which the driving device 62 impels the perturbing element 61 to rotate so that the perturbing element 61 applies the turbulent flow effect to the thermal conductive liquid 32, securing a rapid and uniform diffusion of heat throughout the fin 41 and an upgrading cooling performance.

Notwithstanding, the perturbing element 61 in the aforementioned patent has the following two layout patterns:

First one, as shown in FIG. 5 of Appendix 2, has a driving device 62 disposed outside the chamber 31 and a shaft penetrating the chamber 31 from outside in for impelling the perturbing element 61 to rotate.

Such layout, due to an additional driving device 62 disposed outside the chamber 31, makes the overall size of the cooling device and production cost on the hike relatively. Besides, the driving device 62 utilizes a shaft, which penetrates in the chamber, to drive the perturbing element 61 and to form a gap between the shaft and the wall of the chamber 31. As a consequence, the chamber 31 is no longer an enclosed space. While the thermal conductive liquid 32 absorbs the heat of the heat source 80, the pressure inside the chamber 31 will rise, and the thermal conductive liquid 32 is apt to overflow therefrom.

Second one, as shown in FIG. 6 of Appendix 2, extends the rotor shaft of the cooling fan 50 and penetrates in a chamber 31 so as to drive a perturbing element 61 to rotate with it.

Although such layout reduces of the size of the cooling device and the production cost, the issue that the thermal conductive liquid 32 overflows due to the rising pressure inside the chamber 31 still exists. Besides, the perturbing element 61 and the cooling fan 50 synchronously rotate around the same shaft. However, the density of the thermal conductive liquid 32 is greater than air, and thus the resistance born on the perturbing element 61 is higher than that on the cooling fan 50. The resistance born on the perturbing element 61 will be transmitted to the cooling fan 50 via the rotation shaft, resulting in an unstable rotation speed of the cooling fan 50 and an impact on the cooling efficiency.

SUMMARY OF THE INVENTION

In view of this, the invention thus provides a cooling device including a cooling fan and a heatsink. The heatsink is directly attached to the heating element to absorb its heat, and the cooling fan is disposed on top of the heatsink to dissipate the heat. The heatsink contains a central heat dissipation body and a plurality of fins extending from the periphery of the body. The central heat dissipation body has a fully sealed hollow chamber filled with a cooling liquid and disposed an agitator. The agitator is disposed a magnetic element and where the magnetic element corresponds to the rotor of the cooling fan must have a magnetically-attracting and mutually-dragging device in operation. By magnetically dragging the rotor of the cooling fan and the agitator to operate, the cooling liquid carrying heat is secured with better cooling effect due to the agitation. Meanwhile, the chamber remains a fully sealed room without having the overflow issue of cooling liquid and impacting the rotation speed of the cooling fan.

DETAILED DESCRIPTION OF THE PREFERRED EMBODIMENT

Figure 1:
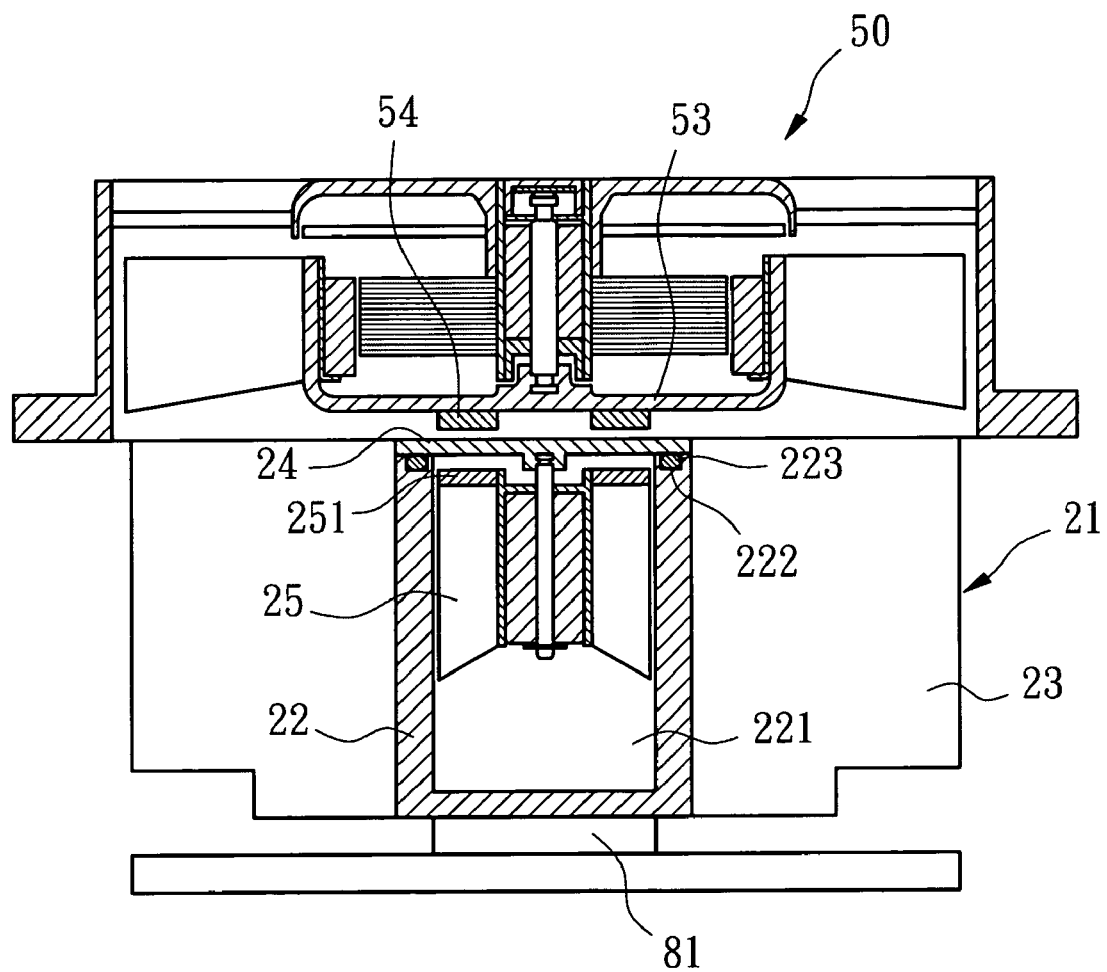
FIG. 1 is a cross-sectional schematic view showing the first preferred embodiment of the present invention.
Figure 2:
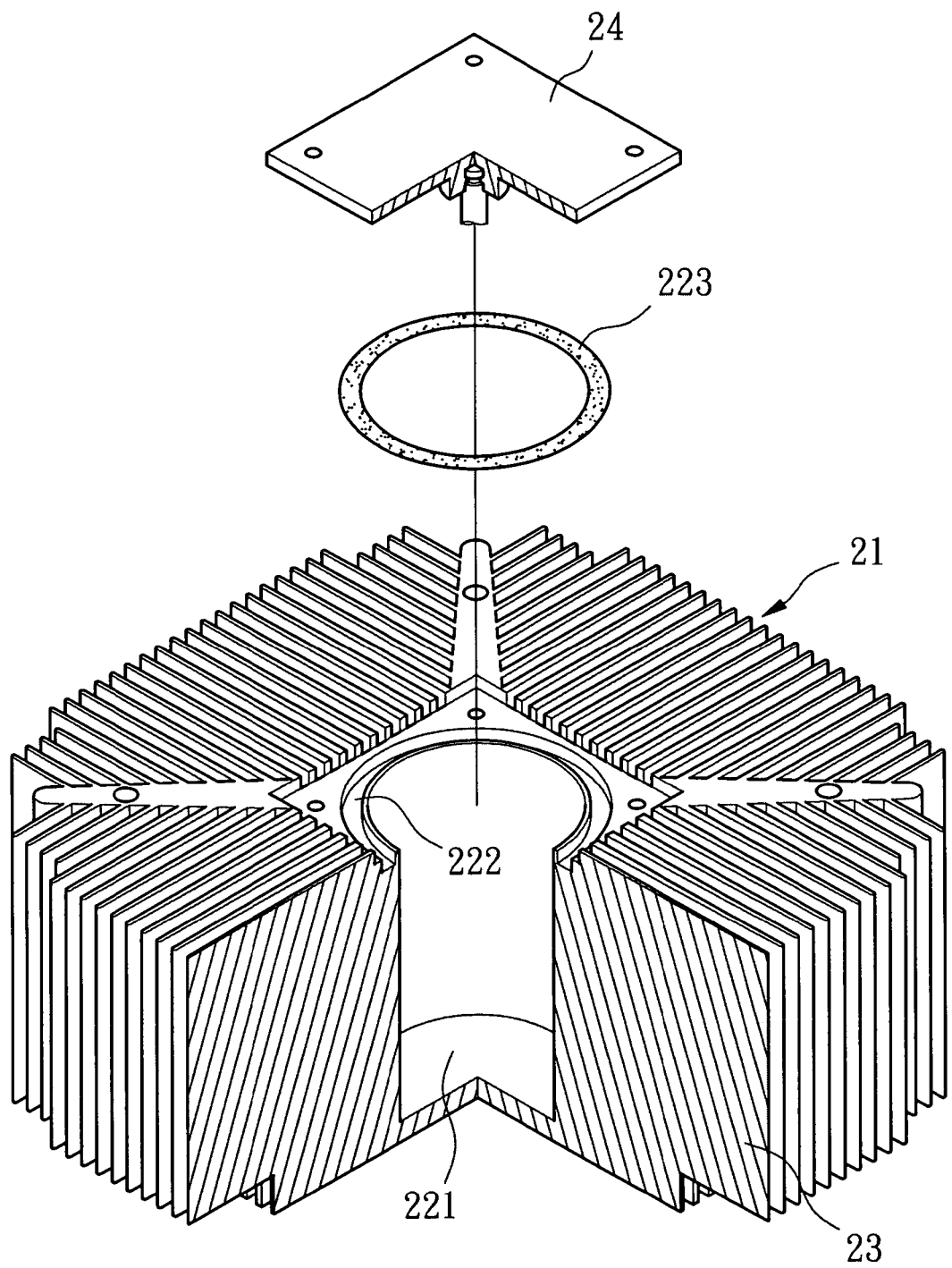
FIG. 2 is an exploded schematic view showing the first preferred embodiment of the present invention.

The invention relates to a cooling device, which includes a cooling fan 50 and a heatsink 21. The heatsink 21 is directly attached to the heating element 81 to absorb the heat, and the cooling fan 50 is disposed on top of the heatsink 21 to dissipate the heat. Several preferred embodiments are illustrated as follows;

FIG. 1 and FIG. 2 show the first preferred embodiment of the present invention, wherein the heatsink 21 contains a central heat dissipation body 22 and a plurality of fins 23 extending from the periphery of the body, the central heat dissipation body 22 directly contacts with the heating element 81 by its bottom and is formed a hollow chamber 221 therein, a cover 24 is disposed on top of the chamber 221, and a ring slot 222 is disposed on top of the central heat dissipation body 22 where corresponds to the cover 24 and is fitted with an O-ring 223 so as to make the chamber 221 a completely sealed room.

In addition, the chamber 221 is filled with a cooling liquid, which may be water, condensate or other liquid capable of having the gaseous and liquid transformation by absorbing heat, and is disposed an agitator 25 inside the cover 24. The agitator 25 has a magnetic element 251, which must have a magnetically-attracting and mutually-dragging device in operation located at where the magnetic element 251 corresponds to the rotor 53 of the cooling fan 50.

As shown in FIG. 1, the mutually-dragging engagement means provides the respective magnetic elements 251, 54 on the agitator 25 and the rotor 53 of the cooling fan 50. The magnetic elements 251, 54 shall be made of the magnetic material, e.g. magnet or metal with magnetic inductivity, and the magnetic elements 251, 54 that are separated by the cover 24 correspond to each other so as to provide the magnetically dragging effect.

Consequently, while rotating the rotor 53 of the cooling fan 50, the agitator 25 can rotate with the rotor 53 of the cooling fan 50 simultaneously, by virtue of the magnetic attraction of the magnetic elements 251, 54, to perturb the cooling liquid filled in the chamber 221. The cooling liquid absorbing the heat is transformed into a dynamic hot liquid and immediately transfers the heat uniformly to every piece of fin 23 to facilitate the heat dissipation of the cooling fan 50 and attain the faster and higher temperature cooling effect.

Figure 3:
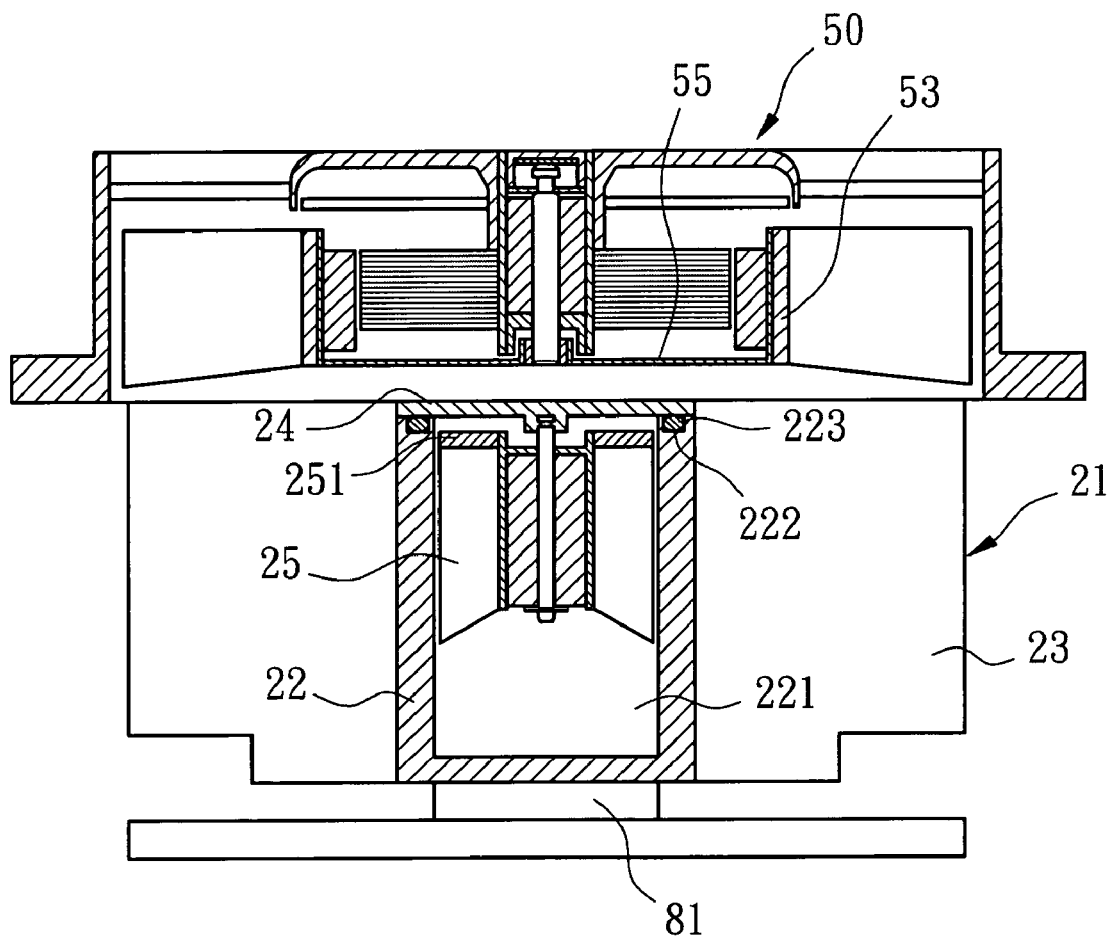
FIG. 3 is a cross-sectional schematic view showing the second preferred embodiment of the present invention.

FIG. 3 shows the second preferred embodiment of the present invention, which the mutually-dragging engagement means for the agitator 25 and the rotor 53 of the cooling fan, also as shown in FIG. 3, has the magnetic element 251 disposed on the agitator 25. The magnetic element 251 shall be a magnet so as to provide the magnetically-dragging function to the iron hub 55 of the motor where corresponds to the rotor 53.

Likewise, the agitator 25 is rotated simultaneously with the rotor 53 of the cooling fan 50 to perturb the cooling liquid inside the chamber 221.

As the agitator 25 is magnetically dragged by the rotor 53 of the cooling fan 50 by way of the magnetic elements 251, 54, upon rotating the rotor 53 of the cooling fan 50, the agitator 25 will dynamically diffuse the heat carried by the liquid to every piece of fin 23. Furthermore, by means of the heat dissipation of the cooling fan 50, a better cooling effect can be secured. Because the cooling fan 50 and the agitator 25 that are mutually dragged to operate via the magnetic elements 251, 54 pertain to an indirect driving operation, the chamber 221 still remains as a fully-sealed room free from the overflow issue of the cooling liquid. Moreover, by way of the magnetic attraction between the rotor 53 of the cooling fan 50 and the agitator 25, despite a higher resistance born on the agitator 25, the rotation speed of the cooling fan won't be affected.

Figure 4:
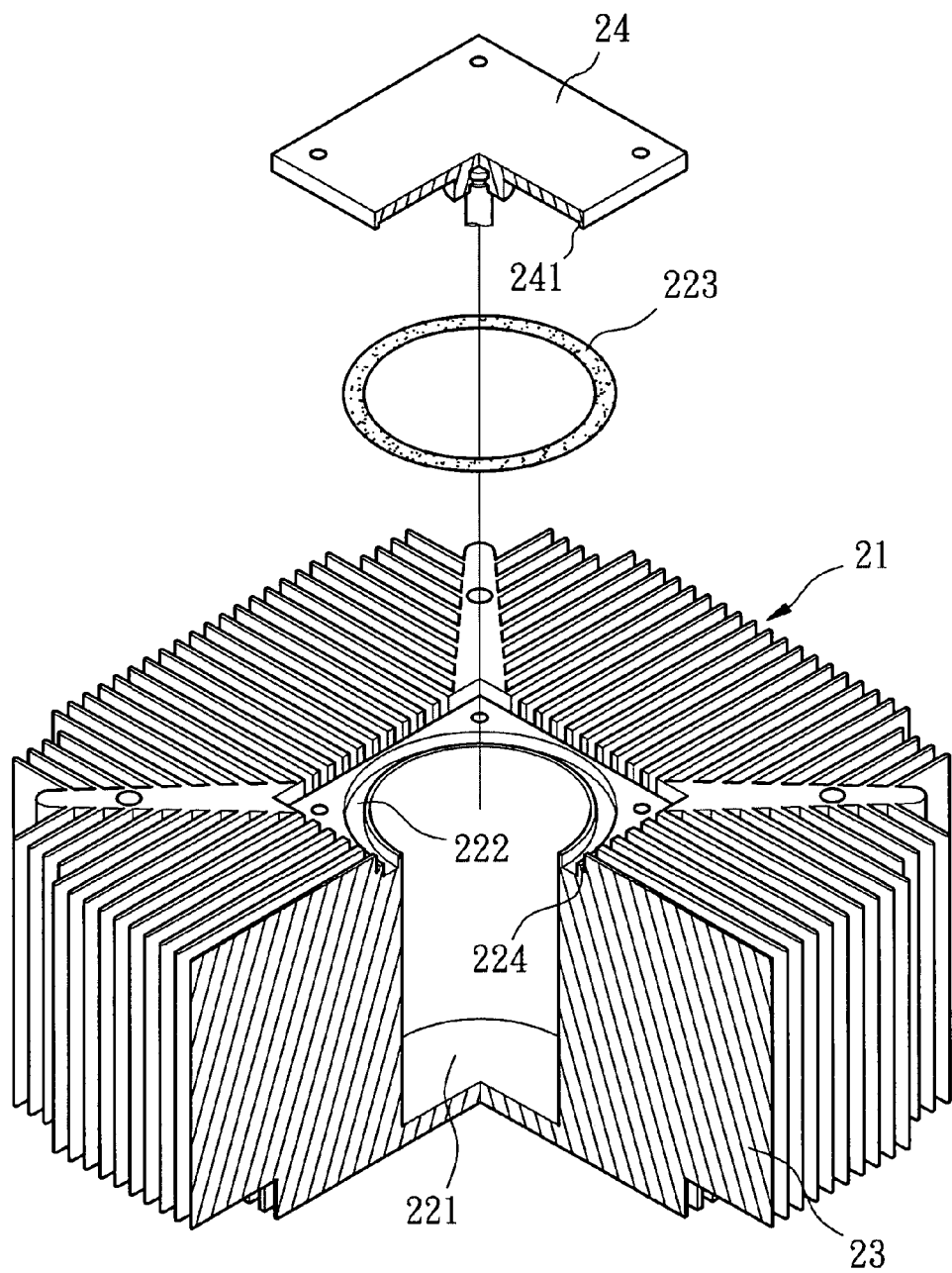
FIG. 4 is an exploded schematic view partially showing the third preferred embodiment of the present invention.

FIG. 4 illustrates the third preferred embodiment of the present invention, wherein the central heat dissipation body 22 is disposed a hole 224 on the top side of the central heat dissipation body 22, where the hole 224 is located on the outer perimeter, the cover 24 is also disposed a protrusion 241 thereon capable of being fitted in the hole 224 to enhance the sealing and positioning effect of the cover 24 and the chamber 221.

Figure 5:
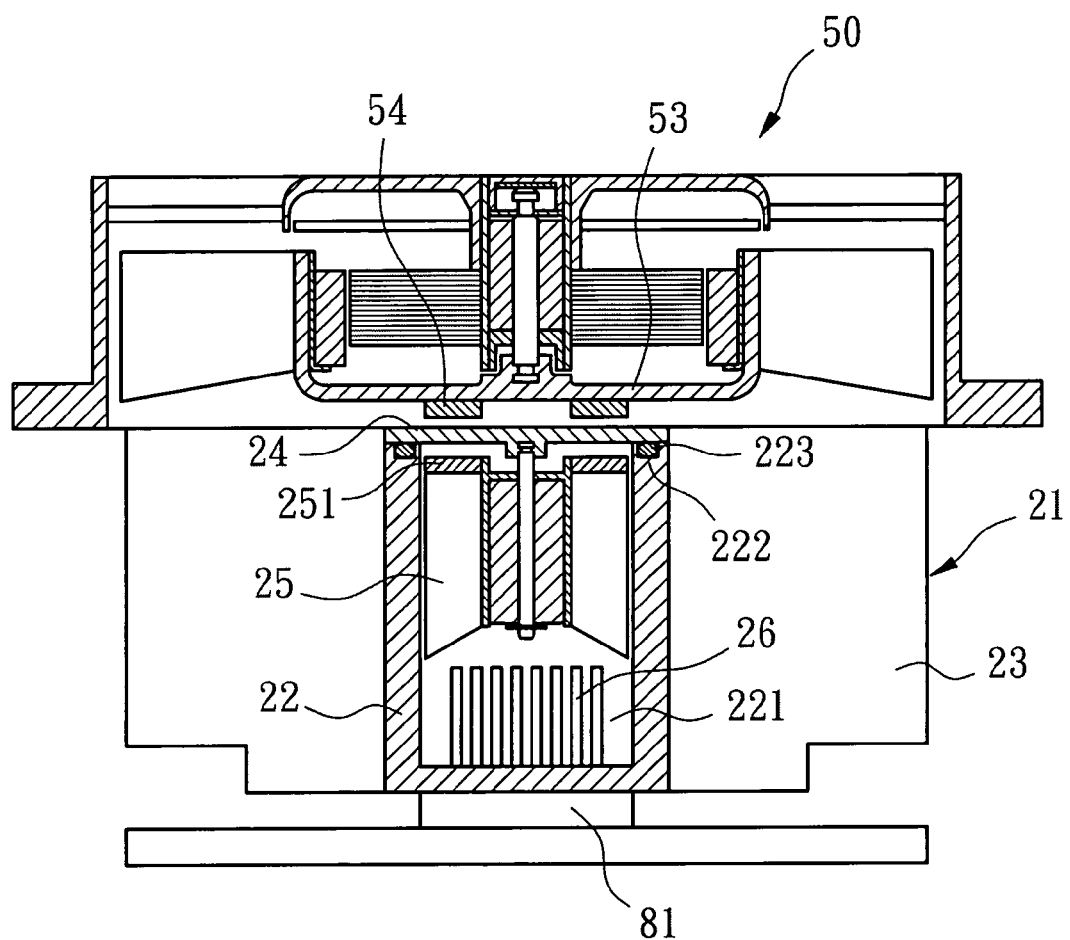
FIG. 5 is a cross-sectional schematic view showing the fourth preferred embodiment of the present invention.

FIG. 5 illustrates the fourth preferred embodiment of the present invention, wherein the inner bottom or the inner wall of the chamber is also capable of being disposed a plurality of fins 26, these fins 26 are used to improve the turbulent effect of the cooling effect so that the heat can be more rapidly and evenly transferred to each fin 23.

In summary, by way of the magnetic attraction between the rotor of the cooling fan and the agitator, the present invention addresses a faster and better heat dissipation effect and maintains the chamber a fully sealing room to get rid off the overflow issue of the cooling liquid and affect no rotation speed of the cooling fan. Therefore, the present invention not only has a novelty and a progressiveness, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A cooling device, comprising:
   a cooling fan; and
   a heatsink further comprising a central heat dissipation body having a fully sealed hollow chamber filled with a cooling liquid and having an agitator therein disposed with a first magnetic element so as to attain a fast heat dissipation effect of said cooling device by way of a magnetically-dragging operation of said cooling fan;
   wherein said central heat dissipation body includes a cover disposed thereon, and a top side of said heat dissipation body corresponding to said cover has a ring slot, which is fitted with an O-ring so as to fully seal said chamber; and wherein said central heat dissipation body includes a recess located around an outer perimeter of said ring slot and corresponding to a protrusion disposed around a perimeter of said cover, said protrusion configured for insertion into said recess.

2. The cooling device of claim 1, wherein said cooling fan and said agitator pertain to an indirect driving operation by virtue of said magnetically-dragging operation.

3. The cooling device of claim 1 further comprising a rotor of said cooling fan, wherein said rotor of said cooling fan includes a second magnetic element, which corresponds to said first magnetic element, and said magnetic elements are chosen from a group consisting of a magnet and a metal having a magnetic inductivity.

4. The cooling device of claim 1, wherein said first magnetic element is a magnet disposed on said agitator, and a magnetic attraction exists between said magnet and an iron motor hub of a rotor.

5. The cooling device of claim 1, wherein said chamber includes a plurality of fins on an inner bottom or an inner wall.

* * * * *